(12) United States Patent
Ikeda et al.

(10) Patent No.: US 12,249,533 B2
(45) Date of Patent: Mar. 11, 2025

(54) SUBSTRATE PROCESSING APPARATUS

(71) Applicant: Tokyo Electron Limited, Tokyo (JP)

(72) Inventors: Yoshinori Ikeda, Kumamoto (JP); Toru Hirata, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 586 days.

(21) Appl. No.: 17/241,504

(22) Filed: Apr. 27, 2021

(65) Prior Publication Data

US 2021/0343576 A1   Nov. 4, 2021

(30) Foreign Application Priority Data

May 1, 2020   (JP) ................................ 2020-081463

(51) Int. Cl.
*H01L 21/687* (2006.01)
*H01L 21/67* (2006.01)

(52) U.S. Cl.
CPC .. *H01L 21/68721* (2013.01); *H01L 21/67051* (2013.01); *H01L 21/67075* (2013.01); *H01L 21/6708* (2013.01); *H01L 21/68728* (2013.01); *H01L 21/68785* (2013.01)

(58) Field of Classification Search
CPC ......... H01L 21/67051; H01L 21/67075; H01L 21/6708; H01L 21/68728
See application file for complete search history.

(56) References Cited

U.S. PATENT DOCUMENTS

| | | | | |
|---|---|---|---|---|
| 5,908,661 A | * | 6/1999 | Batcheldor | G03F 7/162 257/E21.259 |
| 6,767,403 B1 | * | 7/2004 | Chetcuti | H01L 21/6715 118/500 |
| 2005/0026455 A1 | * | 2/2005 | Hamada | H01L 21/3212 257/E21.309 |
| 2007/0240824 A1 | * | 10/2007 | Kaneko | H01L 21/67051 118/52 |
| 2009/0101181 A1 | * | 4/2009 | Morisawa | H01L 21/67028 134/115 R |
| 2010/0212701 A1 | * | 8/2010 | Nanba | H01L 21/68728 134/10 |
| 2010/0227056 A1 | * | 9/2010 | Takayanagi | H01L 21/67051 118/52 |
| 2011/0048469 A1 | * | 3/2011 | Ogata | H01L 21/67051 134/33 |

(Continued)

FOREIGN PATENT DOCUMENTS

| | | |
|---|---|---|
| JP | 10-247632 A | 9/1998 |
| JP | 2006-032637 A | 2/2006 |

(Continued)

*Primary Examiner* — Parviz Hassanzadeh
*Assistant Examiner* — Margaret Klunk
(74) *Attorney, Agent, or Firm* — XSENSUS LLP

(57) ABSTRACT

A substrate processing apparatus according to the present disclosure includes a gripping mechanism and a base plate. The gripping mechanism grips a peripheral edge of a substrate. The base plate is located below the substrate gripped by the gripping mechanism and supports the gripping mechanism. Furthermore, the base plate includes a liquid drain hole that discharges a processing liquid flowing from the substrate to an upper surface of the base plate through the gripping mechanism.

20 Claims, 9 Drawing Sheets

(56) References Cited

U.S. PATENT DOCUMENTS

| | | | | |
|---|---|---|---|---|
| 2014/0026927 A1* | 1/2014 | Ogata | ............... | H01L 21/67051 |
| | | | | 134/104.2 |
| 2015/0343496 A1* | 12/2015 | Song | ...................... | B08B 13/00 |
| | | | | 134/198 |
| 2017/0148660 A1* | 5/2017 | Toyomura | ......... | H01L 21/67051 |
| 2018/0025922 A1* | 1/2018 | Tsujikawa | ......... | H01L 21/67051 |
| | | | | 134/26 |
| 2019/0164786 A1* | 5/2019 | Chen | ................ | H01L 21/68728 |

FOREIGN PATENT DOCUMENTS

| | | | |
|---|---|---|---|
| JP | 2016-105459 A | 6/2016 |
| JP | 2017-92387 A | 5/2017 |
| JP | 2018-170436 A | 11/2018 |

* cited by examiner

SUBSTRATE PROCESSING APPARATUS

CROSS-REFERENCE TO RELATED APPLICATIONS

The present application claims the benefit of priority to Japanese Patent Application No. 2020-081463 filed on May 1, 2020, the entire contents of which Japanese Patent Application are incorporated by reference in the present application.

FIELD

Exemplary embodiments disclosed herein relate to a substrate processing apparatus.

BACKGROUND

In the related art, there is a known substrate processing apparatus that processes a substrate such as a semiconductor wafer by supplying a processing liquid to the substrate.

Japanese Laid-open Patent Publication No. 2017-92387 discloses a substrate processing apparatus including a substrate holding part that holds and rotates a substrate and a supply part that supplies a processing liquid to the substrate held by the substrate holding part.

The substrate holding part includes a base plate located below the substrate, a gripping mechanism provided on a peripheral edge of the base plate to grip a peripheral edge of the substrate, and a rotating shaft provided at a central lower part of the base plate to rotate the base plate.

SUMMARY

A substrate processing apparatus according to an aspect of the present disclosure includes a gripping mechanism and a base plate. The gripping mechanism grips a peripheral edge of a substrate. The base plate is located below the substrate gripped by the gripping mechanism and supports the gripping mechanism. Furthermore, the base plate includes a liquid drain hole that discharges a processing liquid flowing from the substrate to an upper surface of the base plate through the gripping mechanism.

BRIEF DESCRIPTION OF DRAWINGS

More complete recognition of the present invention and advantages associated therewith could be readily understood by reading the following detailed description of the invention in light of the accompanying drawings.

DESCRIPTION OF EMBODIMENTS

Figure 1:
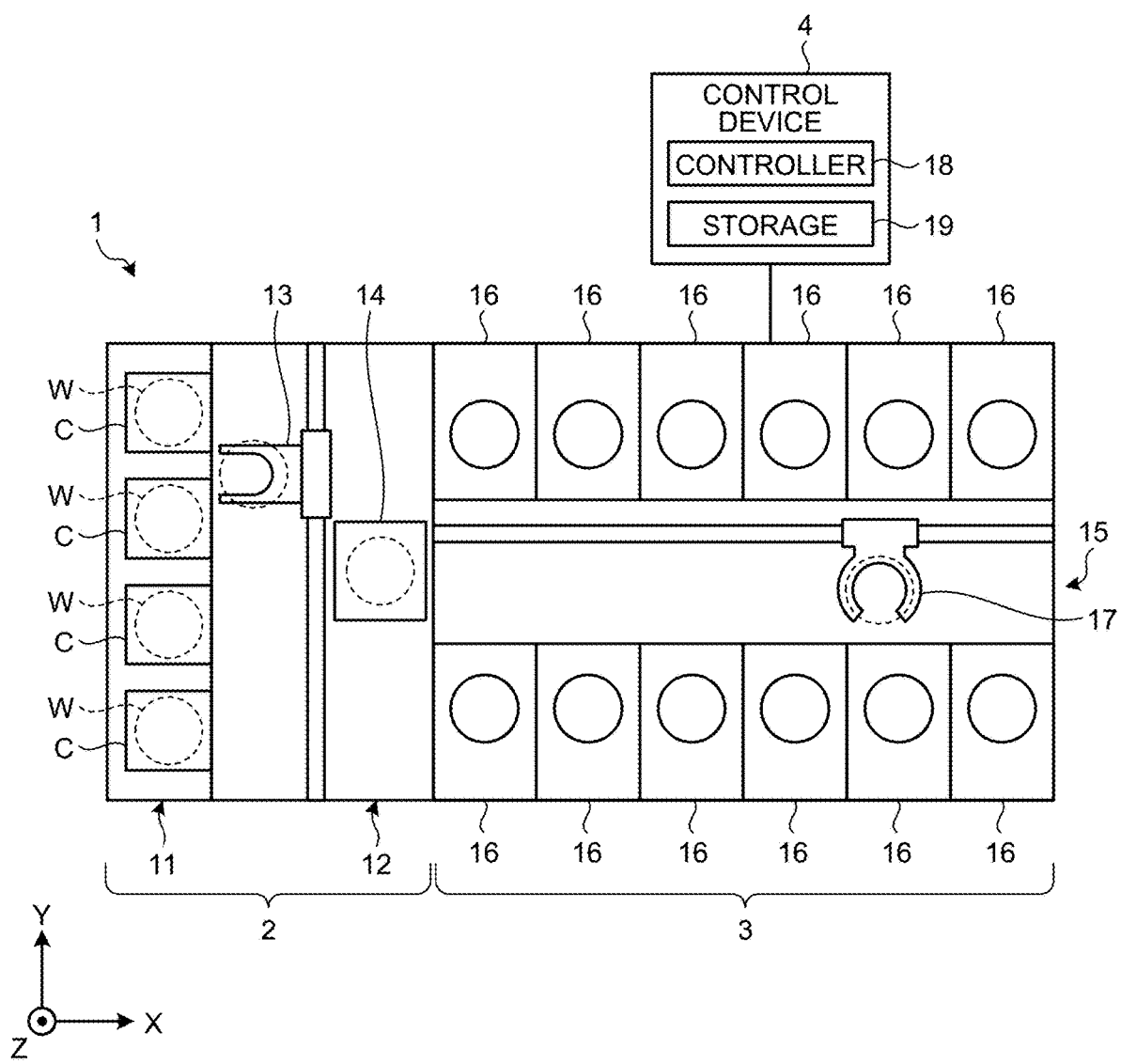
FIG. 1 is a view illustrating a schematic configuration of a substrate processing system according to an embodiment.

Exemplary modes of a substrate processing apparatus disclosed in the present application (hereinafter referred to as "embodiments") will be explained below in detail with reference to the accompanying drawings. The present invention is not limited to the embodiments explained below. Furthermore, the respective embodiments can be appropriately combined without causing a contradiction in processing contents. Furthermore, in the following each embodiment, the same components are denoted by the same reference numerals and redundant description thereof is omitted.

Furthermore, in the embodiments to be described below, expressions such as "constant", "orthogonal", "vertical", or "parallel" may be used, but these expressions do not have to be strictly "constant", "orthogonal", "vertical", or "parallel". That is, it is assumed that the aforementioned each expression allows, for example, deviations in manufacturing accuracy, installation accuracy, and the like.

Furthermore, in each drawing to be referred to below, in order to make the description easy to understand, an orthogonal coordinate system, in which an X-axis direction, a Y-axis direction, and a Z-axis direction orthogonal to one another are defined and a positive Z-axis direction is a vertical upward direction, may be illustrated. Furthermore, a rotation direction with a vertical axis as a rotation center may be called a θ direction.

Japanese Laid-open Patent Publication No. 2017-92387 disclosures a substrate processing apparatus including a substrate holding part that holds and rotates a substrate and a supply part that supplies a processing liquid to the substrate held by the substrate holding part.

The substrate holding part includes a base plate located below the substrate, a gripping mechanism provided on a peripheral edge of the base plate to grip a peripheral edge of the substrate, and a rotating shaft provided at a central lower part of the base plate to rotate the base plate. The substrate holding part holds the substrate in a state of being separated from the base plate by gripping the peripheral edge of the substrate by using the gripping mechanism.

In this type of substrate processing apparatus, particularly, when the substrate is processed at a low number of rotations, the processing liquid supplied to the substrate may flow to the upper surface of the base plate through the gripping mechanism.

Various driving units such as a rotating shaft and a lift pin are disposed on the base plate. Therefore, when the processing liquid flows to the upper surface of the base plate, the inflowing processing liquid may flow into the driving units from the upper surface of the base plate and hinder normal operations of the driving units.

In this regard, especially when processing the substrate at a low number of rotations, expected is a technique that can prevent the processing liquid from flowing out of the substrate and reaching the driving unit such as the rotating shaft through the gripping mechanism and the base plate.

Schematic Configuration of Substrate Processing System

FIG. 1 is a view illustrating a schematic configuration of a substrate processing system according to an embodiment. As illustrated in FIG. 1, a substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. A carrier C is placed on the carrier placing section 11. The carrier C can accommodate a plurality of semiconductor wafers (hereinafter, referred to as wafer W).

The transfer section 12 is provided adjacent to the carrier placing section 11 and includes a substrate transfer device 13 and a delivery unit 14 therein. The substrate transfer device 13 includes a wafer holding mechanism that holds the wafer W. Furthermore, the substrate transfer device 13 can move in a horizontal direction and a vertical direction and is pivotable around the vertical axis, and transfers the wafer W between the carrier C and the delivery unit 14 by using the wafer holding mechanism.

The processing station 3 is provided adjacent to the transfer section 12. The processing station 3 includes a transfer section 15 and a plurality of processing units 16. The processing units 16 are provided side by side on both sides of the transfer section 15.

The transfer section 15 includes a substrate transfer device 17 therein. The substrate transfer device 17 includes a wafer holding mechanism that holds the wafer W. Furthermore, the substrate transfer device 17 can move in the horizontal direction and the vertical direction and is pivotable around the vertical axis, and transfers the wafer W between the delivery unit 14 and the processing units 16 by using the wafer holding mechanism.

The processing unit 16 performs predetermined substrate processing on the wafer W transferred by the substrate transfer device 17.

Furthermore, the substrate processing system 1 includes a control device 4. The control device 4 is, for example, a computer and includes a controller 18 and a storage 19. The storage 19 stores a computer program that controls various processes performed in the substrate processing system 1. The controller 18 controls the operation of the substrate processing system 1 by reading and executing the computer program stored in the storage 19.

Note that the computer program may be recorded on a computer readable storage medium, and may be installed from the storage medium in the storage 19 of the control device 4. Examples of the computer readable storage medium include, for example, a hard disk (HD), a flexible disk (FD), a compact disc (CD), a magnet optical disk (MO), a memory card, and the like.

In the substrate processing system 1 configured as described above, first, the substrate transfer device 13 of the carry-in/out station 2 takes out the wafer W from the carrier C placed on the carrier placing section 11, and places the taken wafer W on the delivery unit 14. The wafer W placed on the delivery unit 14 is taken out from the delivery unit 14 by the substrate transfer device 17 of the processing station 3 and is carried into the processing unit 16.

The wafer W carried into the processing unit 16 is processed by the processing unit 16, and then is carried out from the processing unit 16 by the substrate transfer device 17 and placed on the delivery unit 14. Then, the processed wafer W placed on the delivery unit 14 is returned to the carrier C of the carrier placing section 11 by the substrate transfer device 13.

Schematic Configuration of Processing Unit

Figure 2:
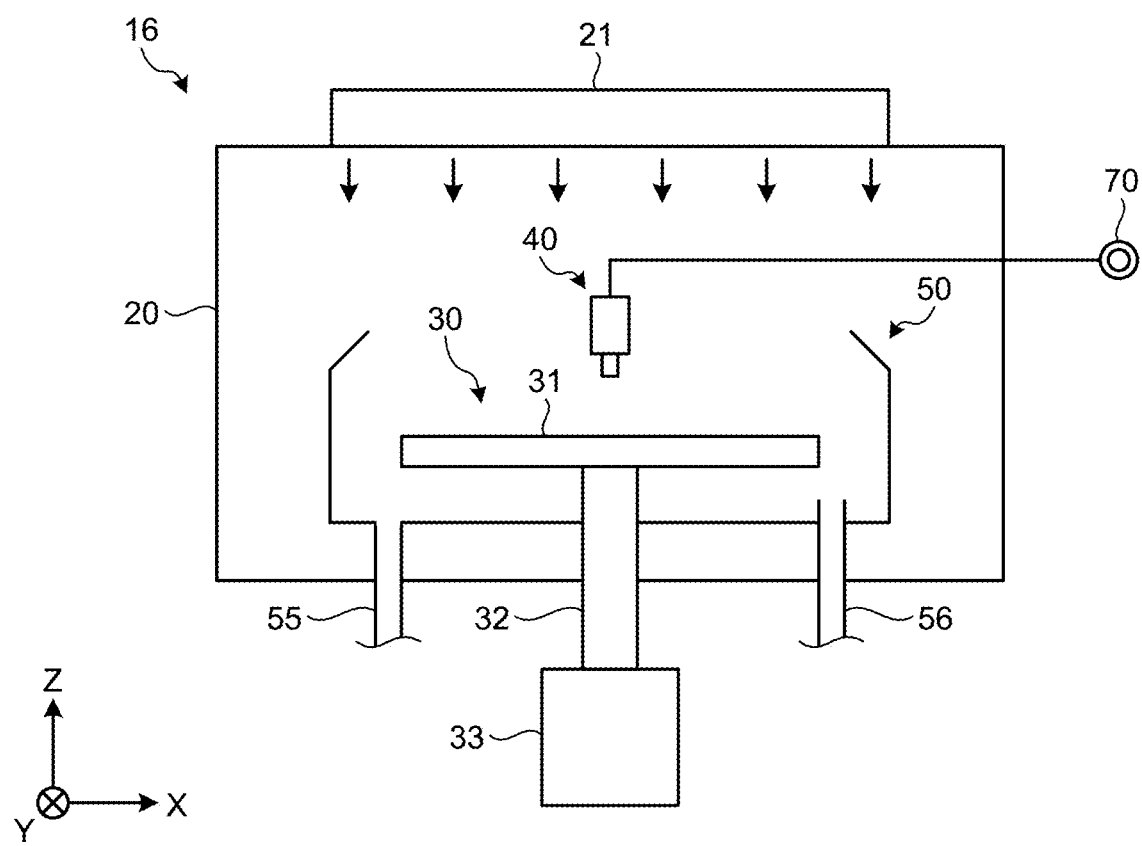
FIG. 2 is a view illustrating a schematic configuration of a processing unit according to an embodiment.

Next, the schematic configuration of the processing unit 16 will be described with reference to FIG. 2. FIG. 2 is a view illustrating a schematic configuration of the processing unit 16 according to an embodiment.

As illustrated in FIG. 2, the processing unit 16 includes a chamber 20, a substrate holding mechanism 30, a liquid supply unit 40, and a recovery cup 50.

The chamber 20 accommodates the substrate holding mechanism 30, the liquid supply unit 40, and the recovery cup 50. The chamber 20 is provided on the ceiling thereof with a fan filter unit (FFU) 21. The FFU 21 forms a downflow in the chamber 20.

The substrate holding mechanism 30 includes a holding unit 31, a supporting unit 32, and a rotation driving unit 33. The holding unit 31 holds the wafer W horizontally. The supporting unit 32 is a member extending in the vertical direction, and horizontally supports the holding unit 31 at the leading end thereof. The rotation driving unit 33 is, for example, a motor and rotates the supporting unit 32 around the vertical axis. The substrate holding mechanism 30 rotates the holding unit 31 supported by the supporting unit 32 by rotating the supporting unit 32 by means of the rotation driving unit 33. With this, the substrate holding mechanism 30 rotates the wafer W held by the holding unit 31.

The liquid supply unit 40 supplies a processing liquid to the wafer W. The liquid supply unit 40 is connected to a processing liquid supply source 70.

The recovery cup 50 is disposed so as to surround the holding unit 31, and collects the processing liquid scattered from the wafer W by the rotation of the holding unit 31. A drain port 55 is formed at the bottom of the recovery cup 50, and the processing liquid collected by the recovery cup 50 is discharged from the drain port 55 to the outside of the processing unit 16. Furthermore, an exhaust port 56 is formed at the bottom of the recovery cup 50 to discharge gas, which is supplied from the FFU 21, to the outside of the processing unit 16.

Specific Configuration of Substrate Holding Mechanism

Figure 3:
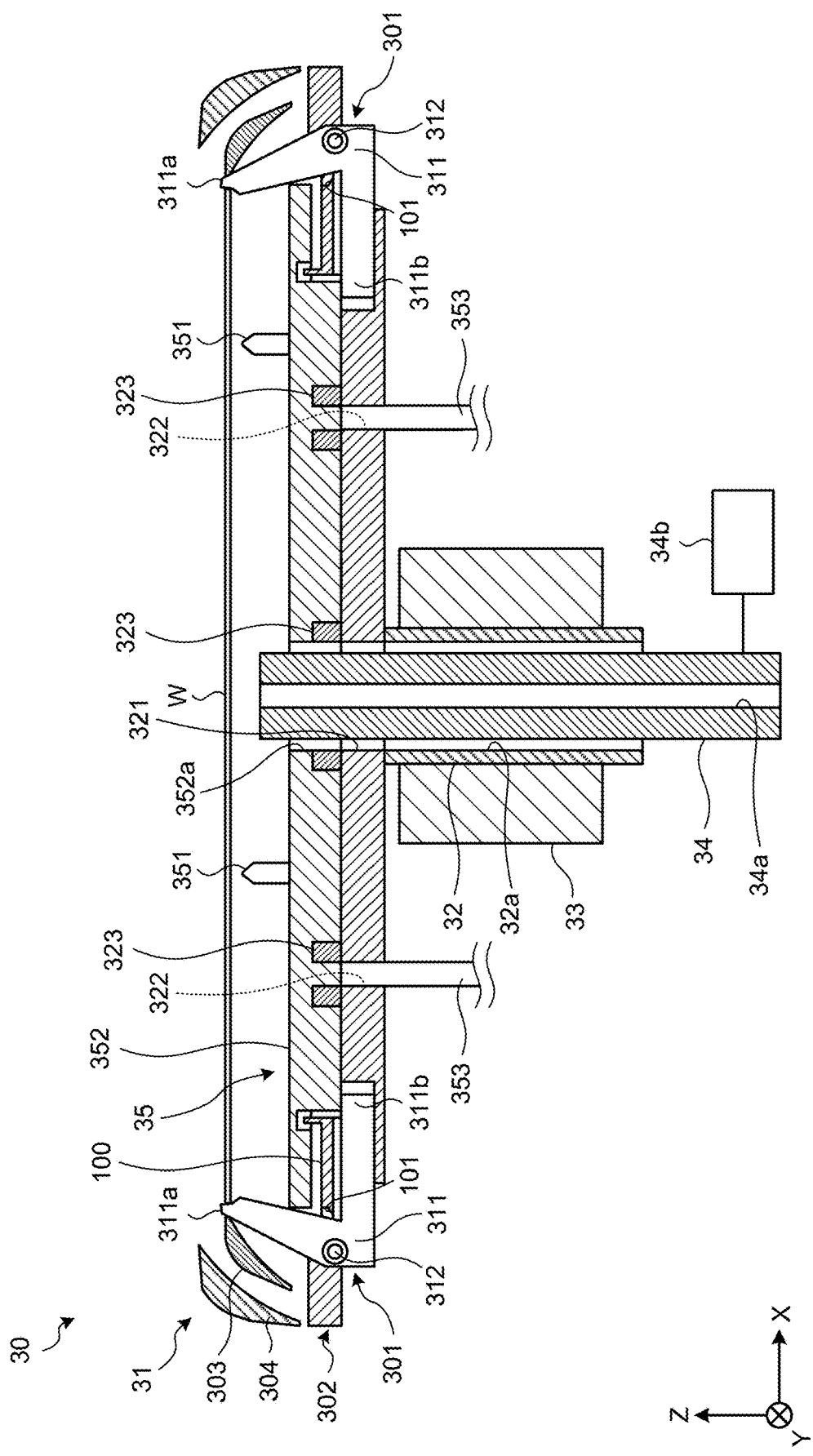
FIG. 3 is a sectional view illustrating a specific configuration of a substrate holding mechanism according to an embodiment.
Figure 4:
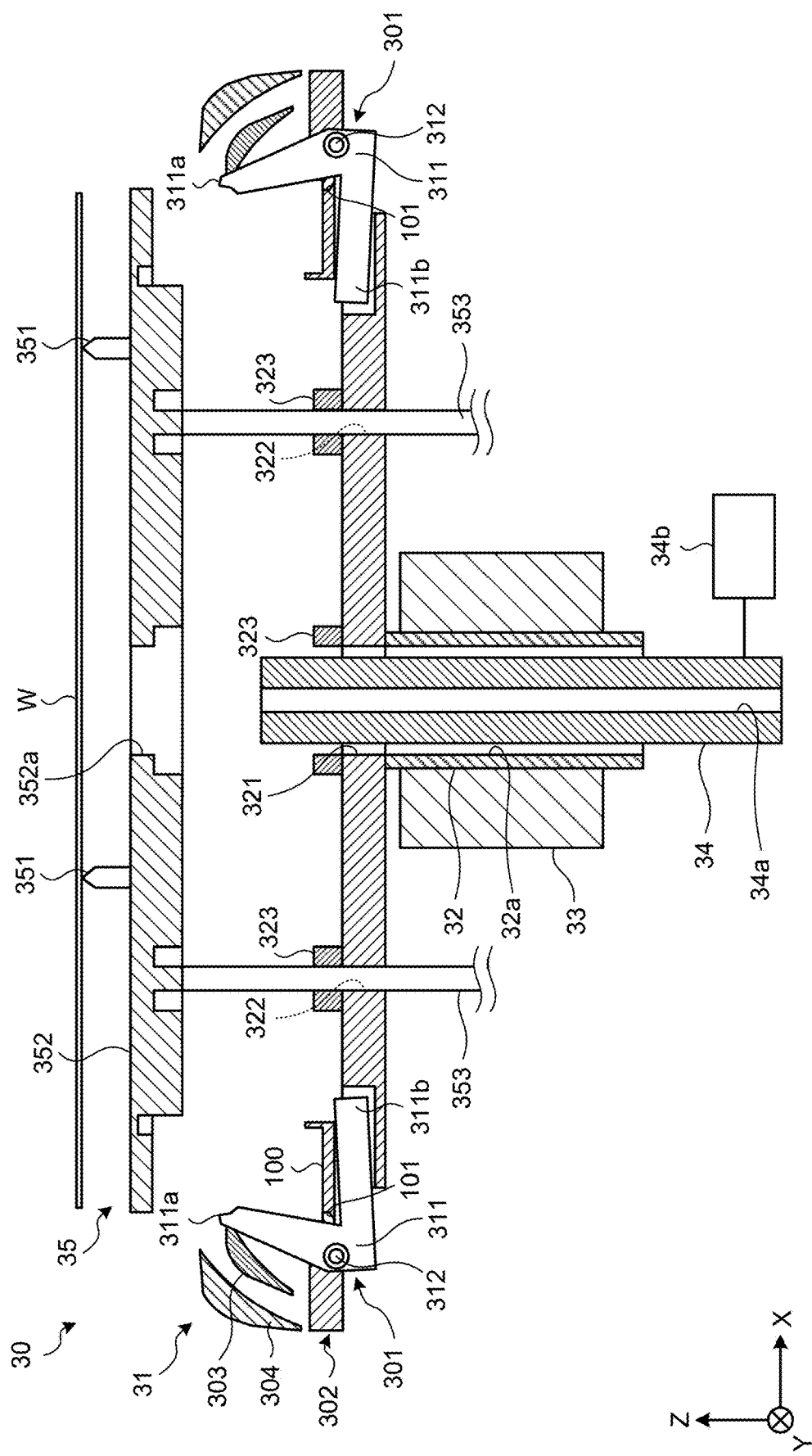
FIG. 4 is a view illustrating a state in which a wafer is disposed at an upper position in the substrate holding mechanism according to an embodiment.

Next, the configuration of the substrate holding mechanism 30 included in the aforementioned processing unit 16 will be described in more detail with reference to FIG. 3 and FIG. 4. FIG. 3 is a sectional view illustrating a specific configuration of the substrate holding mechanism 30 according to an embodiment. Furthermore, FIG. 4 is a view illustrating a state in which the wafer W is disposed at an upper position in the substrate holding mechanism 30 according to an embodiment.

As illustrated in FIG. 3, the holding unit 31 included in the substrate holding mechanism 30 includes a plurality of gripping mechanisms 301 that grip a peripheral edge of the wafer W, and a base plate 302 that supports the gripping mechanisms 301.

The gripping mechanisms 301 each include a body 311 and a rotating shaft 312. The body 311 has a substantially L shape. Specifically, the body 311 includes a gripping part 311*a* extending in one direction to come into contact with the peripheral edge of the wafer W at the leading end thereof, and an operation part 311*b* extending in the other direction to come into contact with a lower surface of a lift pin plate 352, which is to be described below, at the leading end thereof. The rotating shaft 312 is provided on an outer peripheral portion of the base plate 302 and pivotally supports the body 311 to be rotatable with respect to the base plate 302. The operation of the gripping mechanism 301 will be described below.

The base plate 302 is a substantially disk-shaped member having a diameter larger than that of the wafer W, and is located below the wafer W gripped by the gripping mechanisms 301.

A first through hole 321, into which a reverse face supply unit 34 to be described below is inserted, is provided in a central portion of the base plate 302. The first through hole 321 communicates with a hollow part 32a of the supporting unit 32 provided at a lower part of the base plate 302.

A plurality of second through holes 322, into which connection parts 353 of a substrate lifting/lowering mechanism 35 to be described below are respectively inserted, are provided in an intermediate portion of the base plate 302.

A groove part 100 extending along the circumferential direction of the base plate 302 (that is, the circumferential direction of the wafer W) is formed on the outer peripheral portion of the base plate 302. The groove part 100 is formed with a plurality of liquid drain holes 101 for discharging a processing liquid flowing to the upper surface of the base plate 302 from the wafer W through the gripping mechanisms 301.

The liquid drain holes 101 are located outside the aforementioned first through hole 321 and second through holes 322 in the base plate 302. Therefore, the processing liquid flowing to the upper surface of the base plate 302 is discharged from the liquid drain holes 101, so that it is possible to prevent the processing liquid from flowing into the first through hole 321 and the second through holes 322 located inside with respect to the liquid drain holes 101.

The first through hole 321 and the second through holes 322 communicate with the lower part of the base plate 302, and driving units, such as the rotation driving unit 33 and a lifting/lowering driving unit 34b to be described below, are disposed below the base plate 302. Consequently, by preventing the inflow of the processing liquid into the first through hole 321 and the second through holes 322, it is possible to prevent the processing liquid from reaching these driving units.

As described above, since the base plate 302 according to an embodiment includes the liquid drain holes 101, particularly, when the wafer W is processed at a low number of rotations, it is possible to prevent the processing liquid flowing out of the wafer W from reaching the driving units through the gripping mechanism 301 and the base plate 302. The specific configurations of the groove part 100 and the liquid drain hole 101 will be described below.

Furthermore, on the upper surface of the base plate 302, a plurality of peripheral walls 323 are each provided around the first through hole 321 and each of the second through holes 322 to surround the first through hole 321 and the second through hole 322. In this way, the peripheral walls 323 are each provided around the first through hole 321 and the second through holes 322. With this, even though the processing liquid reaches the intermediate portion or the central portion of the base plate 302, it is possible to prevent the processing liquid from flowing into the first through hole 321 and the second through holes 322. Consequently, it is possible to reliably prevent the processing liquid from reaching the driving units located below the base plate 302.

The holding unit 31 further includes a first guide part 303 and a second guide part 304. The first guide part 303 and the second guide part 304 are each a ring-shaped member, and are disposed above the outer peripheral portion of the base plate 302 so as to be separated from the base plate 302. The first guide part 303 and the second guide part 304 are fixed to the base plate 302 by a prop (not illustrated), and rotate together with the base plate 302. The first guide part 303 is disposed inside the second guide part 304.

The first guide part 303 and the second guide part 304 guide the processing liquid flowing out of the rotating wafer W to the recovery cup 50 (see FIG. 2).

Of these, the first guide part 303 is disposed close to the peripheral edge of the wafer W gripped by the gripping mechanisms 301 and is connected to the wafer W via the processing liquid, thereby causing the processing liquid to flow out of the wafer W by using surface tension.

Specifically, an upper surface of the first guide part 303 is disposed at substantially the same height as an upper surface of the wafer W. The processing liquid on the wafer W protrudes from the peripheral edge of the wafer W due to the centrifugal force accompanying the rotation and comes into contact with the upper surface of the first guide part 303. With this, the first guide part 303 and the wafer W are in the state of being connected via the processing liquid. In such a state, the processing liquid on the wafer W moves to the upper surface of the first guide part 303 by surface tension.

The processing liquid having moved to the upper surface of the first guide part 303 passes between the first guide part 303 and the second guide part 304 and reaches the upper surface of the base plate 302. The processing liquid having reached the base plate 302 flows out from between the base plate 302 and the second guide part 304 due to the centrifugal force accompanying the rotation and is collected in the recovery cup 50.

Here, a top face including the upper surface of the first guide part 303 may be hydrophilized by, for example, a blast treatment and the like. When the wafer W is processed at a low number of rotations, the centrifugal force is weakened, so that the flow of the processing liquid on the top face of the first guide part 303 is deteriorated and particularly, the processing liquid tends to stay on the upper surface of the first guide part 303. In this regard, by making the top face of the first guide part 303 hydrophilic to improve the flow of the processing liquid on the top face of the first guide part 303, even when the wafer W is processed at a low number of rotations, it is possible to efficiently discharge the processing liquid.

The substrate holding mechanism 30 further includes the reverse face supply unit 34 and the substrate lifting/lowering mechanism 35. The reverse face supply unit 34 supplies gas such as nitrogen gas to a reverse face of the wafer W.

The reverse face supply unit 34 is inserted into the hollow part 32a of the supporting unit 32, the first through hole 321 of the base plate 302, and a third through hole 352a of the lift pin plate 352 to be described below. A gas supply route 34a is formed inside the reverse face supply unit 34 and is connected to a supply source (not illustrated) via a valve and the like.

The reverse face supply unit 34 is connected to the lifting/lowering driving unit 34b. The lifting/lowering driving unit 34b lifts and lowers the reverse face supply unit 34.

The substrate lifting/lowering mechanism 35 lifts and lowers the wafer W, for example, when the wafer W is delivered to and from the substrate transfer device 17 (see FIG. 1). Specifically, the substrate lifting/lowering mechanism 35 includes a plurality of lift pins 351, a lift pin plate 352, and the connection parts 353.

The lift pins 351 are provided on an upper surface of the lift pin plate 352, and support the wafer W from below when the wafer W is delivered. Note that when the wafer W is disposed at a lower position where the wafer W is gripped by the gripping mechanisms 301, the lift pins 351 do not come into contact with the lower surface of the wafer W.

The lift pin plate 352 is disposed on the upper surface of the base plate 302 so as to overlap the base plate 302. The lift pin plate 352 has a diameter smaller than that of the base plate 302.

A third through hole 352a is provided in a central portion of the lift pin plate 352. The third through hole 352a communicates with the hollow part 32a of the supporting unit 32 and the first through hole 321 of the base plate 302, and the reverse face supply unit 34 is inserted into the third through hole 352a.

The connection parts 353 are each a columnar member and are fixed to the lower surface of the lift pin plate 352. The connection parts 353 are inserted into the second through holes 322 provided in the base plate 302. Note that the connection parts 353 are urged downward by an urging member (for example, a spring) (not illustrated). With this, the lift pin plate 352 is pressed against the base plate 302 and is integrated with the base plate 302.

Furthermore, a lifting/lowering driving unit (not illustrated) is disposed below the connection parts 353. The lifting/lowering driving unit includes, for example, an air cylinder having pistons and cylinders. The lifting/lowering driving unit raises the pistons by the cylinders to cause the pistons to abut the connection part 353 located above the pistons. Then, the lifting/lowering driving unit raises the connection parts 353 by further raising the pistons by the cylinders. With this, as illustrated in FIG. 4, the lift pin plate 352 is raised.

When the lift pin plate 352 is raised, the body 311 of the gripping mechanism 301 pressed by the lift pin plate 352 rotates around the rotating shaft 312, so that the gripping mechanism 301 releases the grip of the wafer W. Then, the wafer W is supported by the lift pins 351 provided on the upper surface of the lift pin plate 352. By so doing, the wafer W is delivered from the gripping mechanism 301 to the lift pins 351.

Configuration of Groove Part and Liquid Drain Hole

Figure 5:
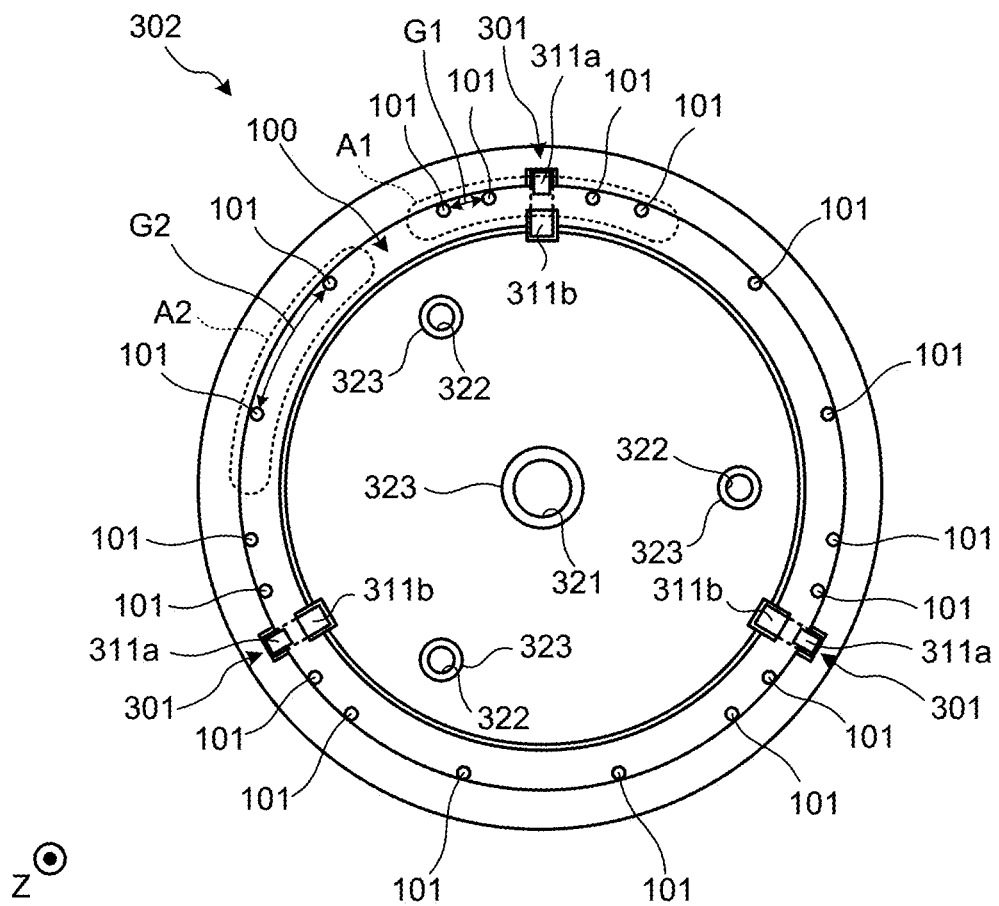
FIG. 5 is a plan view of a base plate according to an embodiment.
Figure 6:
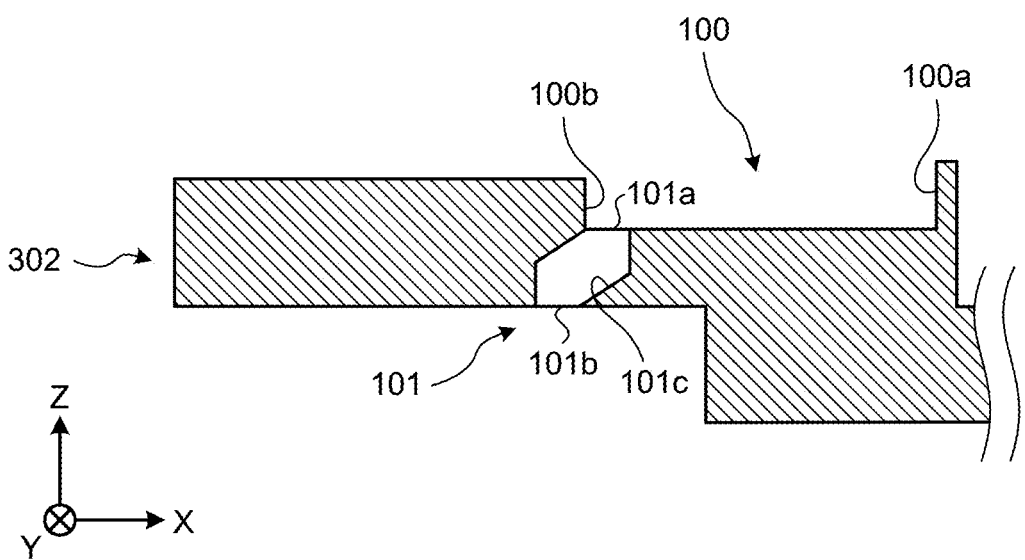
FIG. 6 is a sectional view illustrating a configuration of a liquid drain hole according to an embodiment.

Next, the specific configuration example of the aforementioned groove part 100 and liquid drain hole 101 will be described with reference to FIG. 5 and FIG. 6. FIG. 5 is a plan view of the base plate 302 according to an embodiment. Furthermore, FIG. 6 is a sectional view illustrating the configuration of the liquid drain hole 101 according to an embodiment.

As illustrated in FIG. 5, the groove part 100 extends along the circumferential direction of the wafer W. The groove part 100 is provided on the entire circumference of the base plate 302. The liquid drain holes 101 are provided along the circumferential direction with respect to the groove part 100.

Here, many liquid drain holes 101 are provided around the gripping mechanism 301 in the groove part 100. For example, in the groove part 100, a peripheral area of the gripping mechanism 301 including the gripping mechanism 301 is referred to as a first area A1 and an area not including the gripping mechanism 301 is referred to as a second area A2. In such a case, an interval G1 between the liquid drain holes 101 located in the first area A1 is narrower than an interval G2 between the liquid drain holes 101 located in the second area.

The processing liquid on the wafer W tends to flow into the base plate 302 through the gripping mechanisms 301. Therefore, by providing many liquid drain holes 101 around the gripping mechanisms 301, the processing liquid flowing into the base plate 302 through the gripping mechanisms 301 can be efficiently discharged from the base plate 302.

As illustrated in FIG. 6, the liquid drain hole 101 includes an inflow port 101a opened in the groove part 100, an outflow port 101b opened in the lower surface of the base plate 302, and a flow channel 101c that communicates the inflow port 101a and the outflow port 101b.

The outflow port 101b of the liquid drain hole 101 is located on the outer peripheral side of the base plate 302 with respect to the inflow port 101a, and the flow channel 101c is inclined downward toward the outside of the base plate 302. With such a configuration, the processing liquid stayed in the groove part 100 can be efficiently discharged from the liquid drain hole 101 to the outside of the base plate 302 by the centrifugal force accompanying the rotation of the base plate 302.

The groove part 100 includes a first peripheral wall 100a located on the inner peripheral side of the base plate 302 and a second peripheral wall 100b located on the outer peripheral side of the base plate 302. The first peripheral wall 100a is formed to be higher than the second peripheral wall 100b. With such a configuration, the processing liquid staying in the groove part 100 can be prevented from flowing into the inside of the base plate 302 beyond the first peripheral wall 100a.

Note that more liquid drain holes 101 are provided in the first area A1 than in the second area A2; however, the present disclosure is not limited thereto and for example, an opening area of the liquid drain holes 101 located in the first area A1 may be larger than that of the liquid drain holes 101 located in the second area A2.

Although an example of a case where the shape of the liquid drain hole 101 is circular in the plan view is illustrated herein, the shape of the liquid drain hole 101 may be, for example, a slit shape.

Specific Configuration of Recovery Cup

Figure 7:
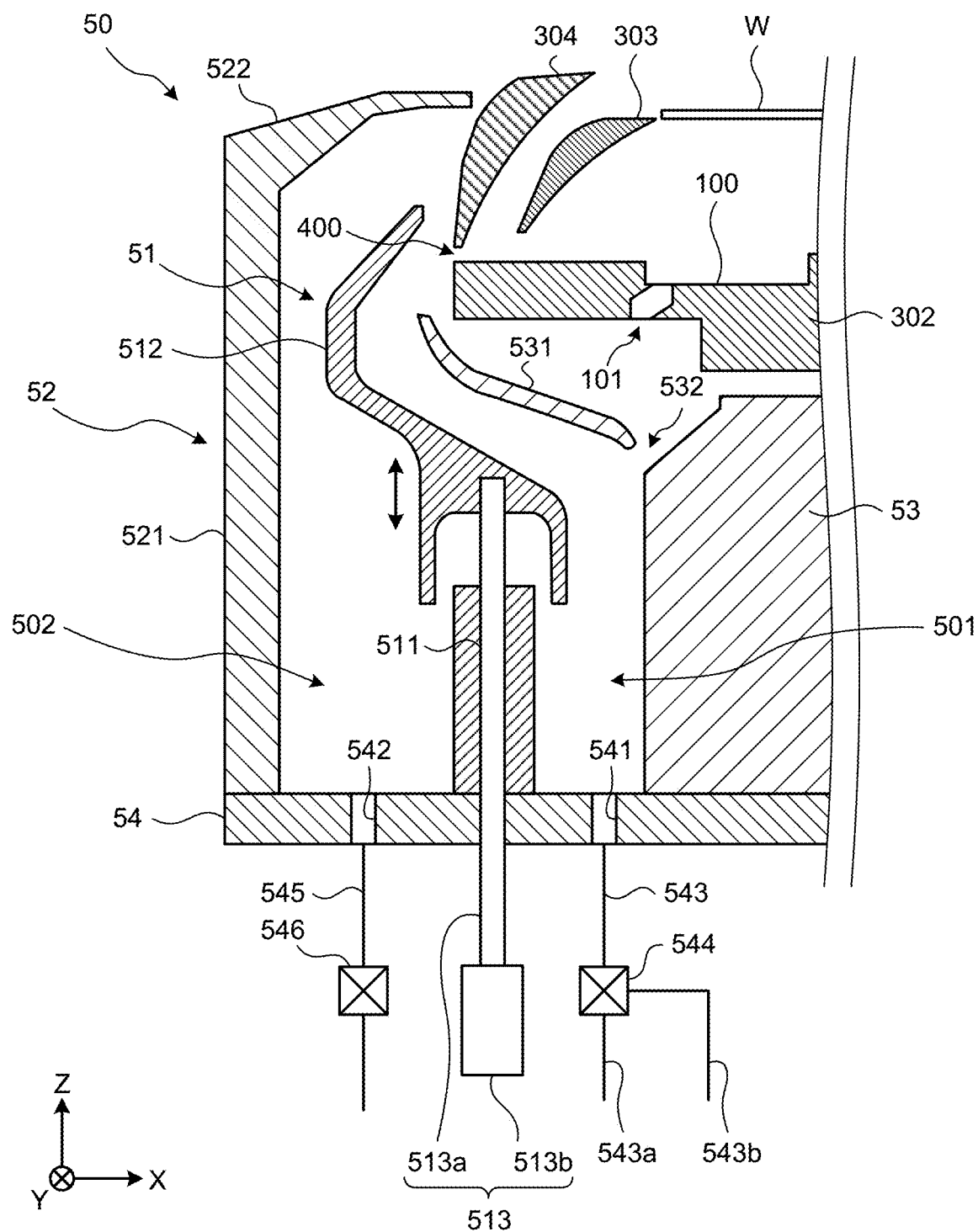
FIG. 7 is a sectional view illustrating a configuration of a recovery cup according to an embodiment.

Next, a specific configuration example of the recovery cup 50 will be described with reference to FIG. 7. FIG. 7 is a sectional view illustrating the configuration of the recovery cup 50 according to an embodiment.

As illustrated in FIG. 7, the recovery cup 50 includes a first cup 51 and a second cup 52 in this order from the inside near the rotation center of the wafer W. Furthermore, the recovery cup 50 includes a cylindrical inner wall 53 centered on the rotation center of the wafer W on the inner peripheral side closer to the rotation center of the wafer W than the first cup 51.

The first cup 51, the second cup 52, and the inner wall 53 are provided on a bottom portion 54 of the recovery cup 50.

The first cup 51 includes a first peripheral wall 511, a first liquid receiving part 512, and a lifting/lowering mechanism 513.

The first peripheral wall 511 is erected from the bottom portion 54 and is formed in a tubular shape (for example, a cylindrical shape). A space is formed between the first peripheral wall 511 and the inner wall 53, and serves as a first drain groove 501 for collecting and discharging the processing liquid and the like. The first liquid receiving part 512 is provided above the first peripheral wall 511.

The lifting/lowering mechanism 513 has a piston 513a that is inserted into a hollow part of the first peripheral wall 511 and connected to a lower surface of the first liquid receiving part 512, and a cylinder 513b that lifts and lowers the piston 513a. The lifting/lowering mechanism 513 lifts and lowers the first liquid receiving part 512 by lifting and lowering the piston 513a by means of the cylinder 513b.

With this, the first liquid receiving part 512 moves between a processing position for receiving the processing liquid scattered from the rotating wafer W and a retracted position retracted downward from the processing position.

Specifically, when the first liquid receiving part 512 is in the processing position, the first liquid receiving part 512 faces a processing liquid outlet 400 formed between the upper surface of the base plate 302 and the second guide part 304. With this, a flow channel leading from the outlet 400 to the first drain groove 501 is formed.

On the other hand, the inner wall 53 includes an extension part 531 extending obliquely upward from the inner wall 53 toward the peripheral edge of the base plate 302. When the first liquid receiving part 512 is in the retracted position, the first liquid receiving part 512 abuts the extension part 531 of the inner wall 53. With this, a flow channel leading to the first drain groove 501 is blocked.

The second cup 52 includes a second peripheral wall 521 and a second liquid receiving part 522. The second peripheral wall 521 is erected on the outer peripheral side of the first peripheral wall 511 at the bottom portion 54 and is formed in a tubular shape. A space between the second peripheral wall 521 and the first peripheral wall 511 serves as a second drain groove 502 for collecting and discharging the processing liquid and the like.

The second liquid receiving part 522 is formed so as to be continuous from an upper end of the second peripheral wall 521. The second liquid receiving part 522 is formed so as to surround the periphery of the wafer W held by the holding unit 31, and to extend above the first liquid receiving part 512.

The second liquid receiving part 522 faces the outlet 400 when the first liquid receiving part 512 is in the retracted position. With this, a flow channel leading from the outlet 400 to the second drain groove 502 is formed.

The bottom portion 54 is formed with a first drain port 541 and a second drain port 542. The first drain port 541 communicates with the first drain groove 501, and the second drain port 542 communicates with the second drain groove 502.

The first drain port 541 is connected to a drain tube 543. A valve 544 is interposed in the middle of the drain tube 543, and the drain tube 543 is branched into a first drain tube 543a and a second drain tube 543b at the position of the valve 544. As the valve 544, for example, it is possible to use a three-way valve that can be switched among a valve closing position, a position where a discharge path is opened to the first drain tube 543a side, and a position where the discharge path is opened to the second drain tube 543b side.

The first drain tube 543a is connected to, for example, a waste liquid tank (not illustrated). On the other hand, the second drain tube 543b is connected to the processing liquid supply source 70 (see FIG. 1), and returns drained liquid to the processing liquid supply source 70. That is, the second drain tube 543b constitutes a part of a circulation line. When the processing liquid is reusable, the valve 544 is switched to the second drain tube 543b to allow the processing liquid to flow thereinto.

The second drain port 542 is connected to a drain tube 545. A valve 546 is interposed in the drain tube 545. The drain tube 545 is connected to, for example, the waste liquid tank (not illustrated).

The extension part 531 of the inner wall 53 is located below the liquid drain hole 101. The extension part 531 is formed at the bottom end thereof with a communication port 532. The communication port 532 communicates with the first drain groove 501.

The processing liquid flowing out of the liquid drain hole 101 is received by the extension part 531, flows into the first drain groove 501 through the communication port 532, and then flows out from the first drain port 541 to the outside. In this way, the liquid drain hole 101 is connected to the first drain port 541 via the communication port 532 and the first drain groove 501. Therefore, for example, it is not necessary to provide a dedicated drain port for discharging the processing liquid flowing into the inside of the base plate 302.

Specific Operation of Processing Unit

Figure 8:
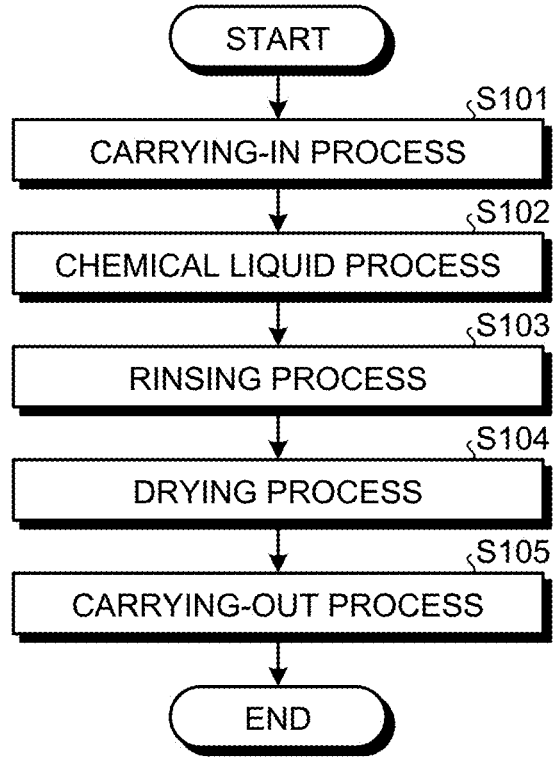
FIG. 8 is a flowchart illustrating a series of substrate processing procedures performed by the processing unit according to an embodiment.

Next, a specific operation example of the processing unit 16 will be described with reference to FIG. 8. FIG. 8 is a flowchart illustrating a series of substrate processing procedures performed by the processing unit 16 according to an embodiment. Each device included in the substrate processing system 1 performs each processing procedure illustrated in FIG. 8 under the control of the controller 18.

As illustrated in FIG. 8, the processing unit 16 first performs a carrying-in process (step S101). In the carrying-in process, the wafer W carried into the chamber 20 (see FIG. 2) by the substrate transfer device 17 (see FIG. 1) is held by the holding unit 31. Specifically, the wafer W is first placed on the lift pins 351 of the substrate lifting/lowering mechanism 35 disposed at the upper position. Thereafter, the substrate lifting/lowering mechanism 35 is lowered and is disposed at the lower position. When the substrate lifting/lowering mechanism 35 is lowered, the lift pin plate 352 of the substrate lifting/lowering mechanism 35 presses the operation parts 311b of the gripping mechanisms 301. With this, the gripping parts 311a of the gripping mechanisms 301 rotate to grip the peripheral edge of the wafer W.

Thereafter, the base plate 302 is rotated by the rotation driving unit 33. With this, the wafer W rotates together with the base plate 302 while being horizontally gripped by the gripping mechanisms 301.

Subsequently, the processing unit 16 performs, for example, a chemical liquid process using a chemical liquid such as an etchant (step S102). In the chemical liquid process, the liquid supply unit 40 (see FIG. 2) is located above the center of the wafer W. Thereafter, the chemical liquid such as an etchant is supplied to the upper surface (for example, a pattern-formed surface) of the wafer W.

The etchant supplied to the wafer W spreads on the top face of the wafer W due to the centrifugal force accompanying the rotation of the wafer W. With this, the upper surface of the wafer W is treated with the chemical liquid. The chemical liquid supplied to the wafer W scatters to the outside of the wafer W due to the centrifugal force accompanying the rotation of the wafer W. Specifically, the chemical liquid on the wafer W moves to the upper surface of the first guide part 303, and then reaches the outer peripheral portion of the upper surface of the base plate 302 by passing between the first guide part 303 and the second guide part 304. Then, the chemical liquid flows out of the base plate 302 from the outlet 400 (see FIG. 7) between the base plate 302 and the second guide part 304. In the chemical liquid process, the first cup 51 is disposed at the processing position. Consequently, the chemical liquid flowing out of the base plate 302 is received by the first cup 51, and then is discharged from the first drain port 541 through the first drain groove 501.

Furthermore, the chemical liquid flowing into the base plate 302 is once stored in the groove part 100, and then flows out from the liquid drain hole 101 to the bottom of the base plate 302. The chemical liquid flowing out of the liquid drain hole 101 is discharged from the first drain port 541 through the communication port 532 and the first drain groove 501.

Subsequently, the processing unit 16 performs a rinsing process (step S103). In the rinsing process, first, the first liquid receiving part 512 of the first cup 51 moves to the retracted position. Thereafter, a rinse liquid such as deionized water (DIW) is supplied to the upper surface of the wafer W from the liquid supply unit 40. The rinse liquid supplied to the wafer W spreads on the upper surface of the wafer W due to the centrifugal force accompanying the rotation of the wafer W. With this, the chemical liquid remaining on the wafer W is washed away by the rinse liquid. The rinse liquid scattered from the wafer W is discharged from the second drain port 542 through the second drain groove 502.

Subsequently, the processing unit 16 performs a drying process (step S104). In the drying process, by increasing the number of rotations of the wafer W, the rinse liquid remaining on the top face of the wafer W is shaken off and the wafer W is dried.

Subsequently, the processing unit 16 performs a carrying-out process (step S105). In the carrying-out process, the wafer W is taken out from the chamber 20 of the processing unit 16 by the substrate transfer device 17 (see FIG. 1). Thereafter, the wafer W is accommodated in the carrier C placed on the carrier placing section 11 via the delivery unit 14 and the substrate transfer device 13. When the carrying-out process is completed, the processing for one wafer W is completed.

Figure 9:
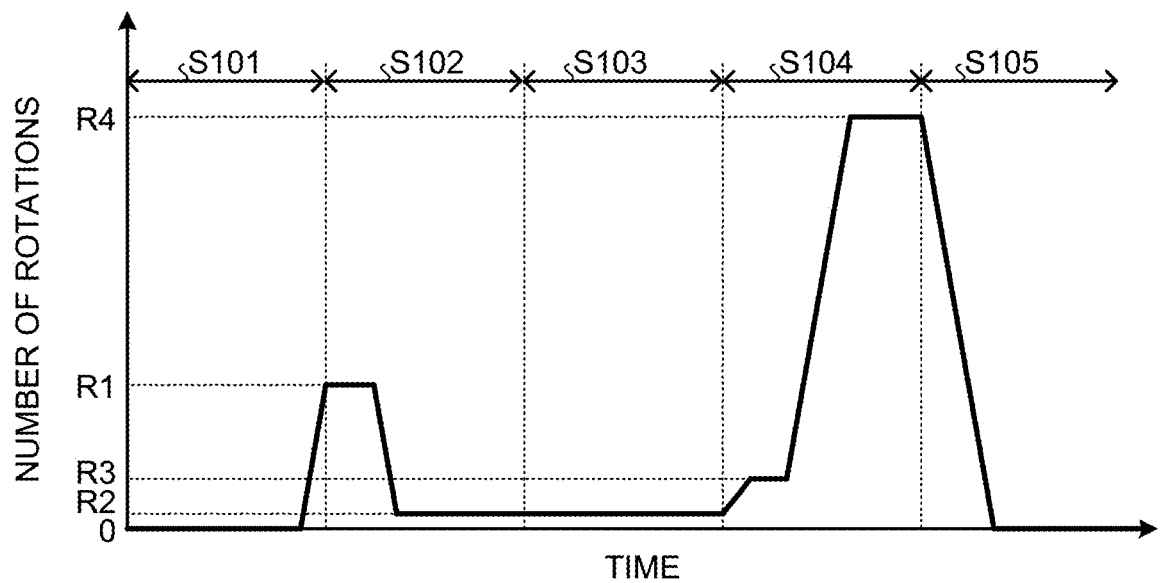
FIG. 9 is a view illustrating changes in the number of rotations of a wafer in a series of substrate processing according to an embodiment.

Hereinafter, control of the number of rotations of the wafer W in the series of substrate processing described above will be described with reference to FIG. 9. FIG. 9 is a view illustrating changes in the number of rotations of the wafer W in the series of substrate processing according to an embodiment.

As illustrated in FIG. 9, in the carrying-in process (step S101), the processing unit 16 grips the wafer W by using the gripping mechanisms 301, starts the rotation of the base plate 302, and increases the number of rotations of the wafer W to a first high number of rotations R1.

Subsequently, in the chemical liquid process (step S102), the processing unit 16 starts the supply of the chemical liquid to the upper surface of the wafer W from the liquid supply unit 40. At this time, the processing unit 16 first rotates the wafer W at the first high number of rotations R1 to spread the chemical liquid supplied on the wafer W over the entire upper surface of the wafer W. Thereafter, the processing unit 16 decreases the number of rotations of the wafer W from the first high number of rotations R1 to a first low number of rotations R2, and continues the supply of the chemical liquid to the upper surface of the wafer W in the state in which the wafer W is rotated at the first low number of rotations R2.

The drain tube 543 (see FIG. 7) is connected to the first drain tube 543a while the wafer W is being rotated at the first high number of rotations R1 in the chemical liquid process. That is, while the wafer W is being rotated at the first high number of rotations R1, the chemical liquid scattered from the wafer W is discharged to the waste liquid tank through the first drain tube 543a. Thereafter, the connection destination of the drain tube 543 is switched to the second drain tube 543b at the timing when the number of rotations of the wafer W is changed to the first low number of rotations R2.

Particles and the like may adhere to the upper surface of the wafer W before the chemical liquid process. In such a case, the particles and the like may be mixed in the chemical liquid scattered from the wafer W immediately after the start of the chemical liquid process. In this regard, in the processing unit 16, the chemical liquid scattered from the wafer W is discharged to the waste liquid tank for a while after the start of the chemical liquid process, and then is collected. With this, it is possible to prevent the particles from being mixed into the circulation line.

Note that, in the chemical liquid process, a process of supplying the chemical liquid to the upper surface of the wafer W while rotating the wafer W at the first low number of rotations R2 corresponds to an example of "when a substrate is processed at a low number of rotations". Furthermore, also in the subsequent rinsing process, the processing unit 16 supplies the rinse liquid to the upper surface of the wafer W while rotating the wafer W at the first low number of rotations R2. This process is also an example of "when a substrate is processed at a low number of rotations".

When the rinsing process is terminated and the drying process is started, the processing unit 16 increases the number of rotations of the wafer W from the first low number of rotations R2 to a second low number of rotations R3. The increase in the number of rotations from the first low number of rotations R2 to the second low number of rotations R3 is slight. For example, when the first low number of rotations R2 is 10 rpm, the second low number of rotations R3 is 30 rpm. Thereafter, the processing unit 16 rotates the wafer W at the second low number of rotations R3 for a predetermined time, and then increases the number of rotations of the wafer W from the second low number of rotations R3 to a second high number of rotations R4.

When the wafer W is processed at a low number of rotations, a large amount of chemical liquid remains on the upper surface of the wafer W as compared with the case where the wafer W is processed at a high number of rotations. Therefore, if the number of rotations of the wafer W is rapidly increased when the rinse liquid on the wafer W is shaken off in the drying process, the large amount of rinse liquid remaining on the wafer W will flow out at once. When the number of rotations of the wafer W at this time is high, the rinse liquid may be intensely scattered to form mist and enter the exhaust port 56 (see FIG. 2) provided in the recovery cup 50. Furthermore, a part of the rinse liquid flowing out of the wafer W may flow into the inside of the base plate 302.

In this regard, in the processing unit 16, in the drying process, the number of rotations of the wafer W is once increased to the second low number of rotations R3 slightly higher than the first low number of rotations R2, and then is increased to the second high number of rotations R4. Most of the rinse liquid on the wafer W can be flowed out of the wafer W by slightly increasing the number of rotations of the wafer W. In this way, the large amount of rinse liquid remaining on the wafer W is removed from the wafer W at a relatively low number of rotations, and then the number of rotations of the wafer W is increased up to a number of rotations suitable for the drying process (the second high number of rotations R4), so that it is possible to prevent the inflow of the rinse liquid into the exhaust port 56.

When the drying process is terminated and the carrying-out process is started, the processing unit 16 stops the rotation of the wafer W.

Alternative Examples

Figure 10:
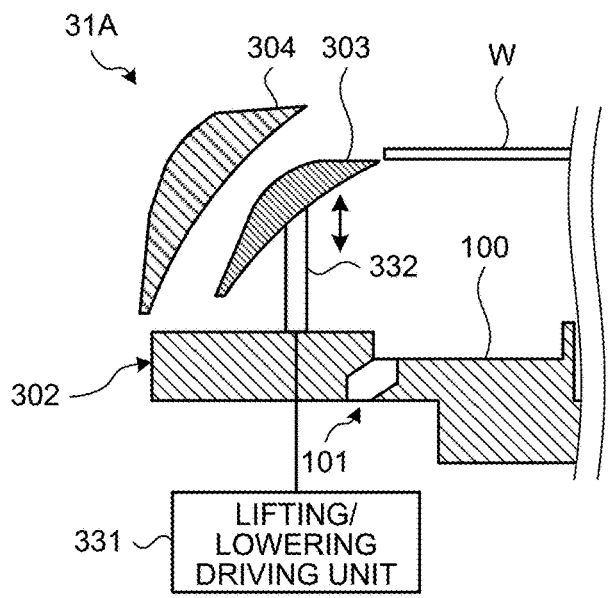
FIG. 10 is a sectional view illustrating a configuration of a holding unit according to a first alternative example.

FIG. 10 is a sectional view illustrating a configuration of a holding unit according to a first alternative example. As illustrated in FIG. 10, a holding unit 31A according to the first alternative example includes a lifting/lowering driving unit 331 that lifts and lowers the first guide part 303. The lifting/lowering driving unit 331 is, for example, connected to a prop 332 that fixes the first guide part 303 to the base plate 302.

Figure 11:
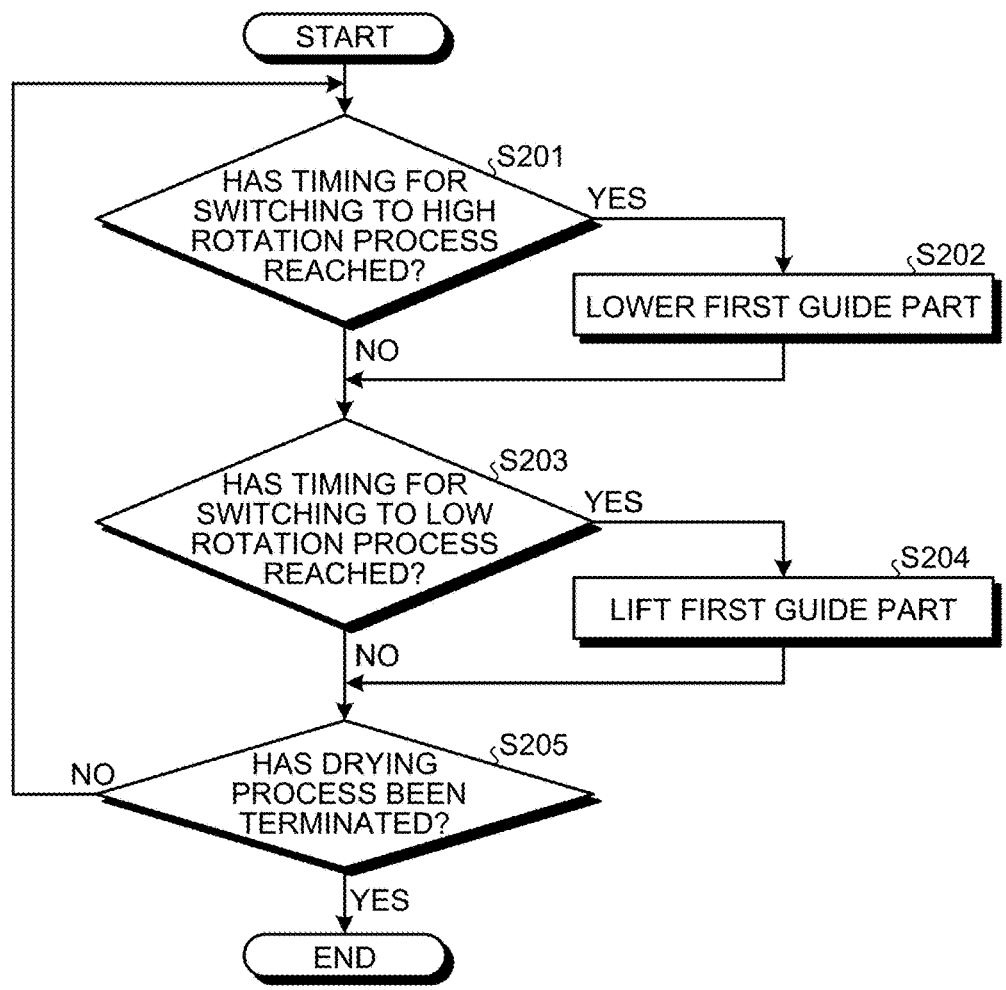
FIG. 11 is a flowchart illustrating a procedure of first guide part lifting/lowering processing according to the first alternative example.

FIG. 11 is a flowchart illustrating a procedure of first guide part lifting/lowering processing according to the first alternative example. As illustrated in FIG. 11, the processing unit 16 determines whether the timing for switching to a high rotation process has reached (step S201). In an embodiment, the high rotation process is a process performed by rotating the wafer W at the first high number of rotations R1 or the second high number of rotations R4.

When it is determined in step S201 that the timing for switching to the high rotation process has reached (Yes at step S201), the processing unit 16 lowers the first guide part 303 by using the lifting/lowering driving unit 331 (step S202).

When the process of step S202 is terminated, the processing unit 16 determines whether the timing for switching to a low rotation process has reached (step S203). Furthermore, even when the timing for switching to the high rotation process has not reached in step S201 (No at step S201) such as when the high rotation process is already in progress, the processing unit 16 shifts the procedure to step S203.

In an embodiment, the low rotation process is a process performed by rotating the wafer W at the first low number of rotations R2 or the second low number of rotations R3. When it is determined in step S203 that the timing for switching to the low rotation process has reached (Yes at step S203), the processing unit 16 lifts the first guide part 303 by using the lifting/lowering driving unit 331 (step S204).

When it is determined in step S203 that the timing for switching to the low rotation process has not reached (No at step S203), or when the process of step S204 is terminated, the processing unit 16 determines whether the drying process has been terminated (step S205). In this process, when the drying process has not been terminated (No at step S205), the processing unit 16 returns the procedure to step S201. On the other hand, when it is determined that the drying process has been terminated (Yes at step S205), the processing unit 16 terminates the first guide part lifting/lowering processing.

In this way, the processing unit 16 may lift the first guide part 303 only during the low rotation process between the high rotation process and the low rotation process, and guide the processing liquid flowing out of the wafer W by using the first guide part 303. With this, during the low rotation process, the processing liquid flows out of the wafer W through the first guide part 303, so that it is possible to reduce the amount of the processing liquid flowing out of the wafer W through the gripping mechanism 301. That is, it is possible to reduce the amount of the processing liquid flowing into the base plate 302 through the gripping mechanism 301, so that it is possible to prevent the processing liquid from reaching the driving unit.

Note that the first guide part 303 does not necessarily have to be ring-shaped. For example, the first guide part 303 may be a columnar member (pin) erected on the upper surface of the base plate 302.

Figure 12:
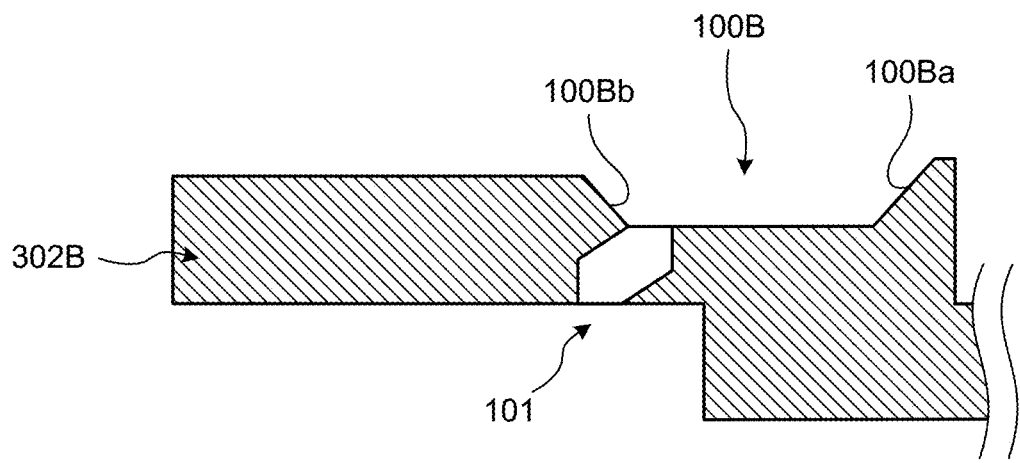
FIG. 12 is a sectional view illustrating a configuration of a groove part according to a second alternative example.

Next, an alternative example of a groove part will be described with reference to FIG. 12 and FIG. 13. FIG. 12 is a sectional view illustrating a configuration of a groove part according to a second alternative example. Furthermore, FIG. 13 is a sectional view illustrating a configuration of a groove part according to a third alternative example.

As illustrated in FIG. 12, in a groove part 100B of a base plate 302B, a first peripheral wall 100Ba and a second peripheral wall 100Bb may be inclined downward toward the inside of the groove part 100B. In this way, by inclining the first peripheral wall 100Ba and the second peripheral wall 100Bb, it is possible to attract the processing liquid into the groove part 100B.

Figure 13:
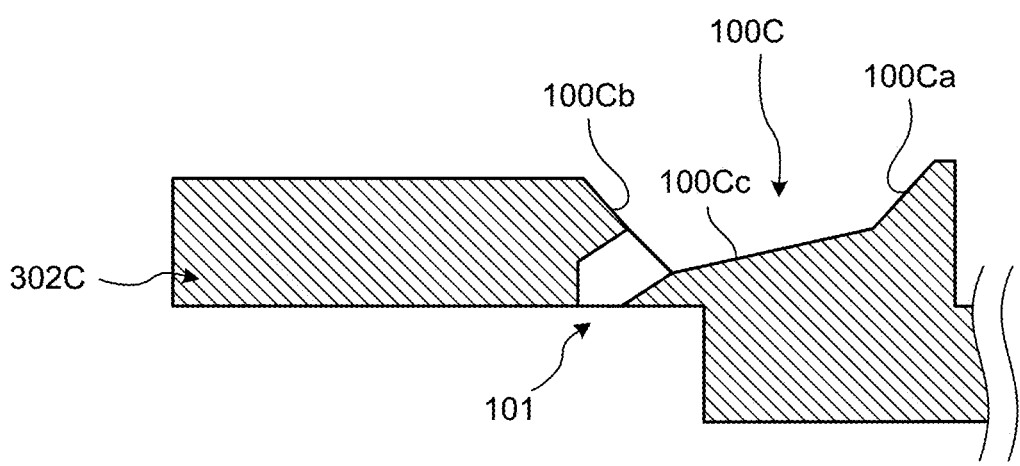
FIG. 13 is a sectional view illustrating a configuration of a groove part according to a third alternative example.

Furthermore, as illustrated in FIG. 13, in a groove part 100C of a base plate 302C, not only a first peripheral wall 100Ca and a second peripheral wall 100Cb but also a bottom surface 100Cc may be inclined. In such a case, the bottom surface 100Cc is preferably inclined downward toward the liquid drain hole 101. In this way, by inclining the bottom surface 100Cc of the groove part 100C downward toward the liquid drain hole 101, the processing liquid staying in the groove part 100C can be efficiently flowed into the liquid drain hole 101. Furthermore, it is possible to prevent the generation of the residue of the processing liquid in the groove part 100C.

As described above, the substrate processing apparatus (as an example, the processing unit 16) according to an embodiment includes a gripping mechanism (as an example, the gripping mechanism 301) and a base plate (as an example, the base plate 302). The gripping mechanism grips a peripheral edge of a substrate (as an example, the wafer W). The base plate is located below the substrate gripped by the gripping mechanism and supports the gripping mechanism. Furthermore, the base plate includes a liquid drain hole (as an example, the liquid drain hole 101) for discharging the processing liquid (as an example, the chemical liquid and the rinse liquid) flowing from the substrate to an upper surface of the base plate through the gripping mechanism.

The base plate may include a groove part (as an example, the groove part 100) provided on the upper surface of the base plate and extending along the circumferential direction of the substrate. In such a case, the liquid drain hole may be provided in the groove part.

The base plate may include a plurality of liquid drain holes provided along the circumferential direction with respect to the groove part. In such a case, an interval (as an example, the interval G1) between the liquid drain holes located in a first area (as an example, the first area A1), which is a peripheral area of the gripping mechanism in the groove part, may be narrower than an interval (as an example, the interval G2) between the liquid drain holes located in a second area (as an example, the second area A2), other than the first area, in the groove part.

The base plate may include a plurality of liquid drain holes. In such a case, the liquid drain holes may include first liquid drain holes located in the first area which is the peripheral area of the gripping mechanism in the groove part, and second liquid drain holes located in the second area, other than the first area, in the groove part. Furthermore, an opening area of the first liquid drain holes may be larger than that of the second liquid drain holes.

The groove part may include a first peripheral wall (as an example, the first peripheral wall 100a) located on an inner peripheral side of the base plate, and a second peripheral wall (as an example, the second peripheral wall 100b) located on an outer peripheral side of the base plate. In such a case, a height of the first peripheral wall may be higher than a height of the second peripheral wall.

The liquid drain hole may include an inflow port (as an example, the inflow port 101a) opened in the upper surface of the base plate, and an outflow port (as an example, the outflow port 101*b*) opened in the lower surface of the base plate. In such a case, the outflow port may be located on the outer peripheral side of the base plate with respect to the inflow port.

The substrate processing apparatus according to an embodiment may include a guide member (as an example, the first guide part 303). The guide member is disposed close to the peripheral edge of the substrate gripped by the gripping mechanism and is connected to the substrate via the processing liquid, thereby causing the processing liquid to flow out from the substrate. In such a case, the guide member may have a hydrophilic surface.

The substrate processing apparatus according to an embodiment may include a lifting/lowering driving unit (as an example, the lifting/lowering driving unit 331) that lifts and lowers the guide member.

The base plate may include through holes (as an example, the first through hole 321 and the second through holes 322) provided inside the base plate with respect to the liquid drain hole and penetrating the base plate, and peripheral walls (as an example, the peripheral walls 323) provided on the upper surface of the base plate to surround the through holes.

The substrate processing apparatus according to an embodiment may include a liquid supply unit (as an example, the liquid supply unit 40), a rotation driving unit (as an example, the rotation driving unit 33), and a controller (as an example, the controller 18). The liquid supply unit supplies the processing liquid to the substrate gripped by the gripping mechanism. The rotation driving unit rotates the base plate. The controller controls the liquid supply unit and the rotation driving unit. In such a case, the controller performs liquid processes (as an example, the chemical liquid process and the rinsing process) of supplying the processing liquid to the substrate by controlling the liquid supply unit while rotating the substrate at a first number of rotations (as an example, the first low number of rotations R2) by controlling the rotation driving unit, and a drying process of shaking off the processing liquid on the substrate by increasing the number of rotations of the substrate to a second number of rotations (as an example, the second high number of rotations R4) higher than the first number of rotations by controlling the rotation driving unit after the liquid processes. In such a case, before increasing the number of rotations of the substrate to the second number of rotations, the controller may increase the number of rotations of the substrate to a third number of rotations (as an example, the second low number of rotations R3) higher than the first number of rotations and lower than the second number of rotations.

In accordance with the substrate processing apparatus according to an embodiment, particularly, when the substrate is processed at a low number of rotations, it is possible to prevent the processing liquid flowing out of the substrate from reaching the driving units through the gripping mechanisms and the base plate.

It should be considered that an embodiment(s) as disclosed herein is/are illustrative in every manner and is/are not limitative. In fact, it is possible to implement an embodiment(s) as described above in a variety of forms. Furthermore, an embodiment(s) as described above may be omitted, substituted, or modified in a variety of forms without departing from the appended claims and a spirit thereof.

What is claimed is:

1. A substrate processing apparatus comprising:
    a plurality of gripping mechanisms that grip a peripheral edge of a substrate; and
    a base plate located below the substrate gripped by the plurality of gripping mechanism and supporting the plurality of gripping mechanisms, wherein
    the base plate includes a plurality of liquid drain holes that discharge a processing liquid flowing from the substrate to an upper surface of the base plate through the plurality of gripping mechanisms,
    the base plate includes a groove part provided on the upper surface of the base plate at a position where the processing liquid flows from the substrate to the upper surface of the base plate through the plurality of gripping mechanisms to extend along a circumferential direction of the substrate,
    the liquid drain holes are provided in the groove part along the circumferential direction of the substrate, and
    an interval between the liquid drain holes located in a first area that includes peripheral areas of each gripping mechanism of the plurality of gripping mechanisms in the groove part is less than an interval between the liquid drain holes located in a second area, other than the first area, in the groove part.

2. The substrate processing apparatus according to claim 1, wherein
    the liquid drain holes include a first liquid drain hole located in the first area and a second liquid drain hole located in the second area, and
    an opening area of the first liquid drain hole is greater than an opening area of the second liquid drain hole.

3. The substrate processing apparatus according to claim 2, wherein
    the groove part includes:
        a first peripheral wall extending in a direction normal to the largest surface of the base plate located on an inner peripheral side of the base plate; and
        a second peripheral wall located on an outer peripheral side of the base plate and outside the first peripheral wall, and
    a height of the first peripheral wall is greater than a height of the second peripheral wall.

4. The substrate processing apparatus according to claim 3, wherein
    the liquid drain holes each include:
        an inflow port opened in the upper surface of the base plate; and
        an outflow port opened in a lower surface of the base plate, and
    the outflow port is located on the outer peripheral side of the base plate with respect to the inflow port.

5. The substrate processing apparatus according to claim 4, further comprising:
    a guide member disposed close to the peripheral edge of the substrate gripped by the plurality of gripping mechanisms and connected to the substrate via the processing liquid to cause the processing liquid to flow out of the substrate, wherein
    the guide member has a hydrophilic surface.

6. The substrate processing apparatus according to claim 5, further comprising a lifting/lowering driving unit including an air cylinder that lifts and lowers the guide member.

7. The substrate processing apparatus according to claim 6, wherein the base plate includes:
    a through hole provided inside the base plate with respect to the liquid drain holes and penetrating the base plate; and
    a peripheral wall provided on the upper surface of the base plate to surround the through hole.

8. The substrate processing apparatus according to claim 7, further comprising:
a liquid supplier that supplies the processing liquid to the substrate gripped by the plurality of gripping mechanisms;
a rotation driving motor that rotates the base plate; and
a controller configured to control the liquid supplier and the rotation driving motor to perform a process including:
supplying the processing liquid to the substrate while rotating the substrate at a first number of rotations per unit time,
increasing the number of rotations per unit time of the substrate to a second number of rotations per unit time higher than the first number of rotations per unit time, after the supplying the processing liquid to the substrate, and
increasing the number of rotations per unit time of the substrate to a third number of rotations per unit time higher than the second number of rotations per unit time to shake off the processing liquid on the substrate, after increasing the number of rotations per unit time of the substrate to the second number of rotations per unit time.

9. The substrate processing apparatus according to claim 3, wherein the second peripheral wall extends in the direction normal to the largest surface of the base plate.

10. The substrate processing apparatus according to claim 3, wherein the second peripheral wall includes an inclined surface that is inclined downward toward an inside of the groove part.

11. The substrate processing apparatus according to claim 10, wherein the first peripheral wall includes an inclined surface that is inclined downward toward the inside of the groove part.

12. The substrate processing apparatus according to claim 1, wherein each of the liquid drain holes includes a surface that is parallel to a direction normal to the largest surface of the base plate and a surface that is not parallel to the direction normal to the largest surface of the base plate.

13. The substrate processing apparatus according to claim 1, wherein the groove part is disposed above a lower portion of each of the plurality of gripping mechanisms in a direction normal to the largest surface of the base plate such that an imaginary line parallel to the direction normal to the largest surface of the base plate would pass through the groove part and a respective one of the plurality of gripping mechanisms.

14. A substrate processing apparatus comprising:
a plurality of gripping mechanisms that grip a peripheral edge of a substrate; and
a base plate located below the substrate gripped by the plurality of gripping mechanisms and supporting the plurality of gripping mechanisms, wherein
the base plate includes a plurality of liquid drain holes that discharges a processing liquid flowing from the substrate to an upper surface of the base plate through the plurality of gripping mechanisms,
the base plate includes a groove part provided on the upper surface of the base plate at a position where the processing liquid flows from the substrate to the upper surface of the base plate through the plurality of gripping mechanisms to extend along a circumferential direction of the substrate,
the liquid drain holes are provided in the groove part,
the liquid drain holes include a first liquid drain hole located in a first area that includes peripheral areas of each gripping mechanism of the plurality of gripping mechanisms in the groove part, and a second liquid drain hole located in a second area, other than the first area, in the groove part, and
an opening area of the first liquid drain hole is greater than an opening area of the second liquid drain hole.

15. The substrate processing apparatus according to claim 14, wherein
the groove part includes:
a first peripheral wall extending in a direction normal to the largest surface of the base plate located on an inner peripheral side of the base plate; and
a second peripheral wall located on an outer peripheral side of the base plate and outside the first peripheral wall, and
a height of the first peripheral wall is greater than a height of the second peripheral wall.

16. The substrate processing apparatus according to claim 14, wherein
the liquid drain holes each include:
an inflow port opened in the upper surface of the base plate; and
an outflow port opened in a lower surface of the base plate, and
the outflow port is located on the outer peripheral side of the base plate with respect to the inflow port.

17. The substrate processing apparatus according to claim 14, further comprising
a guide member disposed close to the peripheral edge of the substrate gripped by the plurality of gripping mechanisms and connected to the substrate via the processing liquid to cause the processing liquid to flow out of the substrate, wherein
the guide member has a hydrophilic surface.

18. The substrate processing apparatus according to claim 17, further comprising
a lifting/lowering driving unit including an air cylinder that lifts and lowers the guide member.

19. The substrate processing apparatus according to claim 14, wherein the base plate includes:
a through hole provided inside the base plate with respect to the liquid drain holes and penetrating the base plate; and
a peripheral wall provided on the upper surface of the base plate to surround the through hole.

20. The substrate processing apparatus according to claim 14, further comprising:
a liquid supplier that supplies the processing liquid to the substrate gripped by the plurality of gripping mechanisms;
a rotation driving motor that rotates the base plate; and
a controller configured to control the liquid supplier and the rotation driving motor to perform a process including:
supplying the processing liquid to the substrate while rotating the substrate at a first number of rotations per unit time,
increasing the number of rotations per unit time of the substrate to a second number of rotations per unit time higher than the first number of rotations per unit time, after the supplying the processing liquid to the substrate, and
increasing the number of rotations per unit time of the substrate to a third number of rotations per unit time higher than the second number of rotations per unit time to shake off the processing liquid on the substrate, after increasing the number of rotations per unit time of the substrate to the second number of rotations per unit time.

\* \* \* \* \*